(12) United States Patent
Chung

(10) Patent No.: US 6,914,013 B2
(45) Date of Patent: Jul. 5, 2005

(54) METHOD OF FORMING SEMICONDUCTOR DEVICE CONTAINING OXIDE/NITRIDE/OXIDE DIELECTRIC LAYER

(75) Inventor: Byung-Hong Chung, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 12 days.

(21) Appl. No.: 10/431,609

(22) Filed: May 8, 2003

(65) Prior Publication Data

US 2003/0201491 A1 Oct. 30, 2003

Related U.S. Application Data

(62) Division of application No. 09/465,928, filed on Dec. 17, 1999, now abandoned.

(30) Foreign Application Priority Data

Dec. 17, 1998 (KR) ........................................ 1998-55903
Jun. 12, 1999 (KR) ........................................ 1999-21943

(51) Int. Cl.$^7$ ...................... H01L 21/31; H01L 21/469; H01L 21/336
(52) U.S. Cl. ...................... 438/770; 438/787; 438/263; 438/264
(58) Field of Search ............................... 438/263, 264, 438/770, 787

(56) References Cited

U.S. PATENT DOCUMENTS

| 5,972,750 | A | 10/1999 | Shirai et al. | |
|---|---|---|---|---|
| 6,163,049 | A | 12/2000 | Bui | |
| 6,248,628 | B1 * | 6/2001 | Halliyal et al. | 438/257 |
| 6,358,864 | B1 * | 3/2002 | Chang et al. | 438/763 |
| 6,380,033 | B1 * | 4/2002 | He et al. | 438/258 |

OTHER PUBLICATIONS

Shimizu, K., et al. "A Novel High–Density 5F2 NAND STI Cell Technology Suitable for 256Mbit and 1Gbit Flash Memories", 1997, IEDM 97, pp. 271–274.*

* cited by examiner

Primary Examiner—Howard Weiss
(74) Attorney, Agent, or Firm—Lee, Sterba & Morse, P.C.

(57) ABSTRACT

A semiconductor device and a method of forming the semiconductor device are disclosed. The semiconductor device includes: a semiconductor substrate; a patterned floating gate formed on the semiconductor substrate, the patterned floating gate having upper and side parts and corners; and a dielectric layer containing a first oxide layer, a nitride layer and a second oxide layer deposited over the semiconductor substrate and the floating gate. The ratio of the thickness of the first oxide layer in the upper and side parts of the patterned floating gate to the thickness of the first oxide layer in the corners of the patterned floating gate does not exceed 1.4. The semiconductor device has an improved coupling coefficient, and reduced leakage current.

24 Claims, 13 Drawing Sheets

METHOD OF FORMING SEMICONDUCTOR DEVICE CONTAINING OXIDE/NITRIDE/OXIDE DIELECTRIC LAYER

This application is a division of application Ser. No. 09/465,928, filed Dec. 17, 1999, now abandoned.

BACKGROUND OF THE INVENTION

1. Field of the Invention

The present invention relates to a semiconductor device, and more particularly, to a method of forming a semiconductor device having a dielectric layer composed of an oxide, a nitride, and an oxide layer.

2. Description of Related Art

Semiconductor memory devices generally are characterized as volatile memory devices, such as DRAM (dynamic random access memory) and SRAM (static random access memory), and nonvolatile memory devices, such as ROM (read only memory), according to how they lose their stored content when the power is cut off. The electrically erasable and programmable ROM (EEPROM) and flash memory are types of nonvolatile memories that are rewritable, except that rewriting is far more time-consuming than just reading. Thus, they typically are used as special-purpose memories where writing is seldom necessary. The flash memory is an advanced type of EEPROM, which may be electrically erased at high speed by using Fowler-Nordheim (F-N) tunneling and hot electrons, without being removed from the circuit board.

It is expected that the flash memory will someday replace the magnetic disk memory because of its various advantages, such as small cell size, quick access time, small power consumption, etc. The cost per bit of producing the flash memory, however, needs to be reduced per bit by decreasing the number of the processing steps required for its fabrication together with its cell size. Accordingly, the art has proposed the flash memory cell having a self-aligned shallow trench isolation (SA-STI) structure in order to reduce the size of the memory cell by forming the floating gate pattern in the same way as the active pattern for defining the active regions in a semiconductor substrate. Forming the respective patterns in this manner decreases the isolation distance between the adjacent bit lines.

The conventional flash memory cell having a SA-STI structure typically includes a stacked gate structure having a floating gate formed over a tunnel oxide layer for F-N tunneling, the tunnel oxide layer being formed in a silicon substrate with the active regions defined by STI. The stacked gate structure also contains a control gate formed over the floating gate with a dielectric interlayer formed therebetween. Data storage is achieved by applying a voltage between the control gate and the substrate to thereby inject or discharge electrons into or from the floating gate. In this case, the dielectric interlayer maintains the charged characteristics and transfers the voltage of the control gate to the floating gate. The amount of the voltage transferred from the control gate to the floating gate is proportional to the coupling coefficient "R" expressed by the following equation:

$$R = \frac{C_{ONO}}{C_{ONO} + C_{TO}}$$

Wherein $C_{ONO}$ is the capacitance of the dielectric interlayer, and $C_{TO}$ is the capacitance of the tunnel oxide layer. In this case, because the capacitance "C" is expressed by the equation $$C = \varepsilon \frac{A}{T},$$

wherein $\varepsilon$ is the dielectric constant, and A and T respectively denote the area and thickness of the dielectric interlayer. The coupling coefficient may be increased either by increasing the area or decreasing the thickness.

It is very difficult, however, to form a thin thermal oxide layer over the floating gate composed of doped polysilicon. Because of this difficulty, as well as the increase of the leakage current, a composite oxide/nitride/oxide layer presently is used for the dielectric interlayer. In addition, the composite layer generally has a greater dielectric constant than the pure oxide layer thereby making its use more advantageous. Known methods of forming the composite layer include growing the first oxide layer by a thermal oxidation process, then depositing a nitride layer by a low-pressure chemical vapor deposition (LPCVD) process, and finally growing the second oxide layer by the thermal oxidation process. For example, fabricating a flash memory having a capacity on the order of about 256 Mb typically includes making the second doped polysilicon layer for the floating gate by oxidization to grow the first oxide layer to a thickness of about 100 Å, then depositing a nitride layer to a thickness of about 130 Å, and finally growing the second oxide layer to a thickness of about 40 Å again by oxidation, thereby obtaining the dielectric interlayer having an equivalent thickness of about 100 to about 200 Å.

The second oxide layer usually is formed to prevent pin holes from being generated in the nitride layer which is structurally not densified when compared to the oxide layer. This second oxide layer helps determine the insulating characteristics of the ONO dielectric layer. In addition, the second oxide layer may be grown to a thickness of about 1500 to about 2000 Å on a bare silicon substrate by wet oxidation. However, the nitride layer coated on the substrate may grow the oxide layer only up to a thickness of about 20 to about 70 Å. In order to form the second oxide layer to a thickness of about 1500 to about 2000 Å by wet oxidation, a high temperature process over 950° C. usually is employed. This high temperature process causes the polysilicon grains of the floating gate contacting the tunnel oxide layer to grow greatly so as to exert a stress to the tunnel oxide layer, thereby degrading it. This problem can be prevented if the second oxide layer is formed with a very thin thickness, but a thin second oxide layer increases the leakage current.

In addition, as the doping concentration of the polysilicon is increased, the thickness of the thermal oxide layer formed on the polysilicon is increased by oxidation enhancement, so that it is very difficult to control the thickness of the first oxide layer within a small value and make the layer thinner. For example, since it is expected that the thickness of the ONO dielectric layer would be about 110 to about 140 Å in a VLSI flash memory having a capacity on the order of 1 Giga-byte, the thermal oxidation is too limited for reducing the thickness to increase the coupling coefficient. Further, if the first oxide layer of the dielectric interlayer is formed over the floating gate by thermal oxidation, the reaction between oxygen and silicon is inadequately made in the corners of the floating gate that have less silicon lattices. Hence, the thickness of the first oxide layer becomes much thinner in the corners than in the side and upper parts, so that the electric field is concentrated in the corners which degrades the breakdown characteristics.

SUMMARY OF THE INVENTION

Thus, there exists a need to provide a semiconductor device with an oxide/nitride/oxide (ONO) dielectric layer of high reliability. There also exists a need to provide a method of fabricating a semiconductor device having an ONO dielectric layer which has an improved capacitance with high reliability. In addition, there exists a need to provide a method of fabricating a nonvolatile memory device having a large coupling coefficient.

The present invention satisfies these needs by providing a semiconductor device having an ONO layer of high reliability. The invention also provides a method of making a semiconductor device having an ONO dielectric layer with improved capacitance with high reliability, as well as a method of making a non-volatile memory device having a large coupling coefficient.

In accordance with these and other features of the present invention, there is provided a semiconductor device comprising: a semiconductor substrate; a patterned floating gate formed on the semiconductor substrate, the patterned floating gate having upper and side parts and corners; and a dielectric layer comprising a first oxide layer, a nitride layer and a second oxide layer deposited over the semiconductor substrate and the floating gate. The ratio of the thickness of the first oxide layer in the upper and side parts of the patterned floating gate to the thickness of the first oxide layer in the corners of the patterned floating gate does not exceed 1.4.

In accordance with another feature of the present invention there is provided a semiconductor device comprising: a semiconductor substrate; a patterned floating gate formed on the semiconductor substrate, the patterned floating gate having upper and side parts and corners; and a dielectric layer deposited over the semiconductor substrate and the floating gate comprising: (i) a first oxide layer formed by a low pressure chemical vapor deposition (LPCVD) process; (ii) a nitride layer formed over the first oxide layer; and (iii) a second oxide layer deposited over the nitride layer and being formed by a low pressure chemical vapor deposition (LPCVD) process. The ratio of the thickness of the first oxide layer in the upper and side parts of the patterned floating gate to the thickness of the first oxide layer in the corners of the patterned floating gate does not exceed 1.4.

According to another feature of the invention, there is provided a method of fabricating a semiconductor device having a composite dielectric layer comprised of a first oxide layer, a nitride layer and second oxide layer, comprising first providing a semiconductor substrate. The method further includes depositing the first oxide layer on the semiconductor substrate by a LPCVD process at a temperature of from about 650 to about 800° C., and at a pressure of from about 1 to about 100 Pa, and subjecting the substrate to a first annealing under an atmosphere of $N_2O$ or NO $NH_3$ to form a surface layer containing less than 5% nitrogen in the first oxide layer. The nitride layer then can be deposited on the first oxide layer, and the second oxide layer deposited on the nitride layer by a LPCVD process at a temperature of from about 650 to about 800° C., and at a pressure of from about 1 to about 100 Pa. The method finally entails subjecting the substrate to a second annealing under an atmosphere of $N_2O$ or NO or $NH_3$ to form a surface layer containing less than 5% nitrogen in the second oxide layer.

In accordance with yet another feature of the present invention, there is provided a method of fabricating a nonvolatile memory device having stacked gate memory cells composed of floating gates, and control gates formed over the floating gates with a dielectric interlayer interposed therebetween, comprising first providing a semiconductor substrate. The memory device can be completed by forming element isolation regions to define active regions in the semiconductor substrate, depositing a floating gate polysilicon layer over the substrate including the element isolation regions, forming the dielectric interlayer, and depositing a control gate polysilicon layer over the dielectric interlayer. The dielectric interlayer is formed by depositing a first oxide layer on the floating gate and the substrate by a LPCVD process at a temperature of from about 650 to about 800° C., and at a pressure of from about 1 to about 100 Pa, and subjecting the substrate to a first annealing under an atmosphere of $N_2O$ or NO or $NH_3$ to form a surface layer containing less than 5% nitrogen in the first oxide layer. The nitride layer then can be deposited on the first oxide layer, and the second oxide layer deposited on the nitride layer by a LPCVD process at a temperature of from about 650 to about 800° C., and at a pressure of from about 1 to about 100 Pa. The method also includes subjecting the substrate to a second annealing under an atmosphere of $N_2O$ or NO or $NH_3$ to form a surface layer containing less than 5% nitrogen in the second oxide layer.

The present invention will now be described more specifically with reference to the drawings attached only by way of example.

BRIEF DESCRIPTION OF THE ATTACHED DRAWINGS

DETAILED DESCRIPTION PREFERRED EMBODIMENTS

Figure 1:
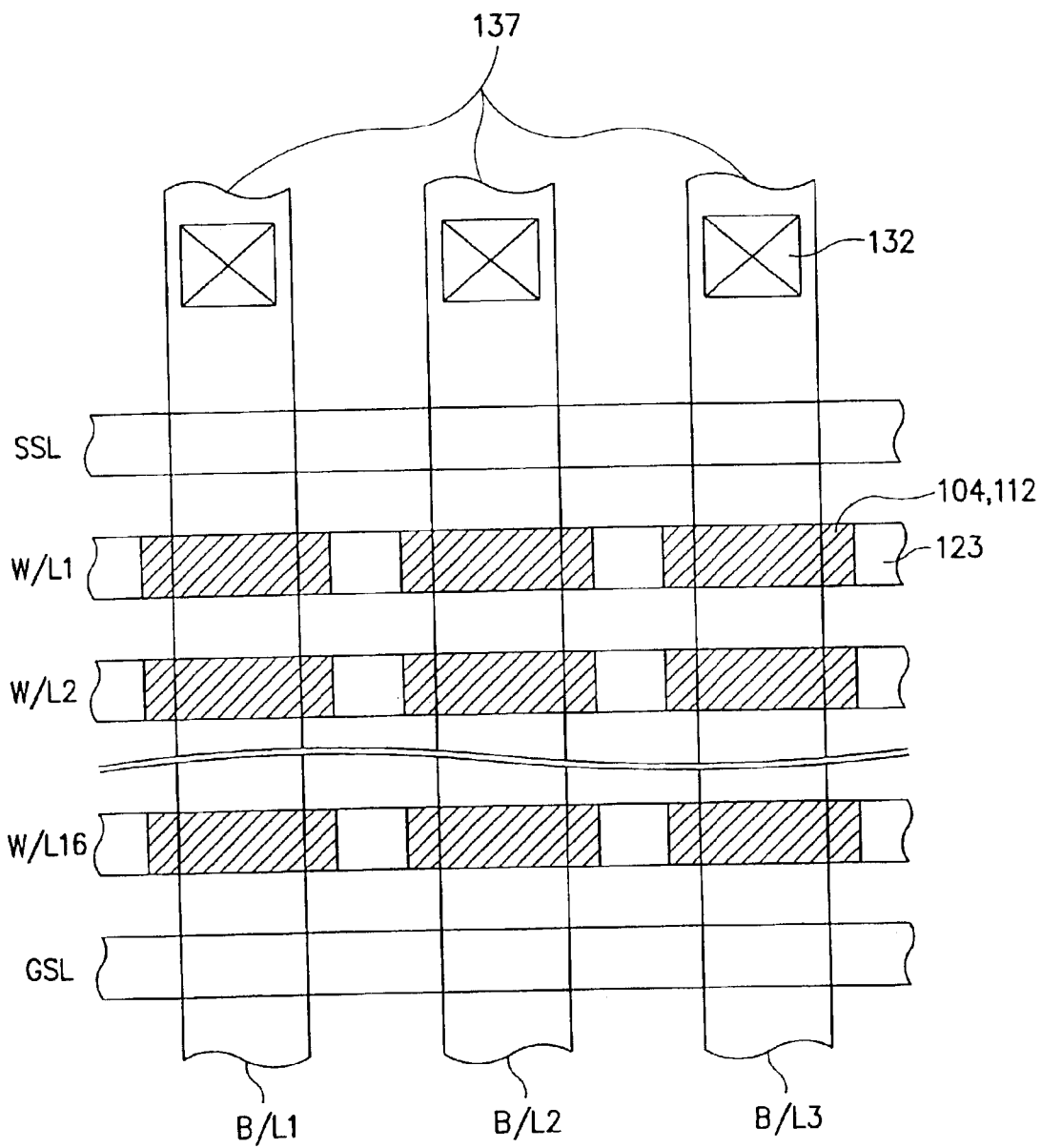
FIG. 1 is a plane view illustrating a flash memory device according to the present invention.

Korean patent application Nos. 1998-55903 and 1999-21943 filed on Dec. 17, 1998, and Jun. 12, 1999, respectively, each entitled "Method of Forming a Composite Oxide/Nitride/Oxide Dielectric Layer" are incorporated by reference herein in their entirety. According to an aspect of the present invention, the semiconductor device comprises a polysilicon pattern, preferably a patterned floating gate polysilicon layer, formed on a semiconductor substrate, and a first oxide layer, a nitride layer and a second oxide layer sequentially deposited over the polysilicon pattern. In the invention, the polysilicon pattern has upper and side parts, and corners, and the ratio of the thickness of the first oxide layer in the upper and side parts of the polysilicon pattern to the thickness of the first oxide layer in the corners of the polysilicon pattern does not exceed 1.4.

According to another aspect of the present invention, the semiconductor device comprises a polysilicon pattern, preferably a patterened floating gate polysilicon layer, formed on a semiconductor substrate, a first oxide layer deposited over the polysilicon pattern by using a low pressure chemical vapor deposition (LPCVD) process, a nitride layer formed over the first oxide layer, and a second oxide layer deposited over the nitride layer by using a LPCVD process. In this aspect of the invention, the polysilicon pattern has upper and side parts, and corners, and the ratio of the thickness of the first oxide layer in the upper and side parts of the polysilicon pattern to the thickness of the first oxide layer in the corners of the polysilicon pattern does not exceed 1.4. Preferably, the first oxide layer has a surface layer that contains less than 5% nitrogen, and the second oxide layer has a surface layer containing less than 5% nitrogen. It also is preferred in the invention that the polysilicon pattern has at least an undulating portion.

According to still another aspect of the present invention, there is provided a method of fabricating a semiconductor device having a composite dielectric layer composed of a first oxide layer, a nitride layer, and a second oxide layer. The method includes depositing the first oxide layer on the substrate by using a LPCVD process at a temperature of from about 650 to about 800° C., and at a pressure of from about 1 to about 100 Pa, and subjecting the substrate to a first annealing under an atmosphere of $N_2O$ or NO or $NH_3$ to form a surface layer containing less than 5% nitrogen in the first oxide layer. The nitride layer then can be deposited on the first oxide layer, and the second oxide layer deposited on the nitride layer by using a LPCVD process at a temperature of from about 650 to about 800° C., and at a pressure of from about 10 to about 100 Pa. The substrate then can be subjected to a second annealing under an atmosphere of $N_2O$ or NO or $NH_3$ to form a surface layer containing less than 5% nitrogen in the second oxide layer. Preferably, the first annealing is performed at a temperature of from about 700 to about 1000° C. In addition, it is preferred that dry or wet oxidation is performed before the first annealing. The second annealing can be performed at a temperature of from about 700 to about 1000° C. or RTA (Rapid Thermal Annealing) about 1050° C. Dry or wet oxidation also can be performed before the second annealing. It is preferred that first oxide layer is deposited and the substrate annealed in the same apparatus. It also is preferred that the second oxide layer is deposited and the substrate annealed in the same apparatus. Moreover, the first oxide layer can be deposited and the substrate annealed, the nitride layer deposited, and the second oxide layer deposited and the substrate annealed, all in the same apparatus.

According to a further aspect of the present invention, there is provided a method of fabricating a nonvolatile memory device having stacked gate memory cells comprised of floating gates, and control gates formed over the floating gates with a dielectric interlayer interposed therebetween. The method includes forming element isolation regions to define active regions in a semiconductor substrate, depositing a polysilicon layer, preferably a patterned floating gate polysilicon layer, over the substrate including the element isolation regions, forming the dielectric interlayer, and depositing a polysilicon layer, preferably a control gate polysilicon layer, over the dielectric interlayer. Those skilled in the art are capable of depositing and forming the respective layers, using the guidelines provided herein.

Forming the dielectric interlayer preferably includes depositing the first oxide layer on the substrate by using a LPCVD process at a temperature of from about 650 to about 800° C., and at a pressure of from about 1 to about 100 Pa, and subjecting the substrate to first annealing under an atmosphere of $N_2O$ or NO or $NH_3$ to form a surface layer containing less than 5% nitrogen in the first oxide layer. The nitride layer then preferably is deposited on the first oxide layer, and the second oxide layer is deposited on the nitride layer using a LPCVD process at a temperature of from about 650 to about 800° C., and at a pressure of from about 1 to about 100 Pa. The substrate then preferably is subjected to a second annealing under an atmosphere of $N_2O$ or NO or $NH_3$ to form a surface layer containing less than 5% nitrogen in the second oxide layer.

The element isolation regions preferably are formed by sequentially depositing a tunnel oxide layer and a polysilicon layer over the substrate, forming a hard mask layer over the polysilicon layer, patterning the hard mask layer with an active pattern, and etching the polysilicon layer and substrate according to the patterned hard mask to form trenches. The element isolation regions are then formed by depositing an oxide layer over the patterned hard mask to fill the trenches, and etching the oxide layer to expose the polysilicon layer. The polysilicon layer preferably is deposited in the crystalline phase in situ at a temperature of about 600° C. or more. Depositing the polysilicon layer typically further includes patterning the polysilicon layer to have at least an undulating portion.

In the present invention, the upper and lower oxide layers of the ONO dielectric interlayer preferably are formed by a LPCVD process, so that the thickness of the oxide layers may be controlled to a small value and made thinner, thus increasing the coupling coefficient. In addition, the substrate preferably is subjected to annealing under an atmosphere of $N_2O$ or NO or $NH_3$ after the LPCVD process to densify the LPCVD formed oxide layer, which reduces the leakage current while improving the charge retention property. Moreover, the annealing under the atmosphere of $N_2O$ or NO or $NH_3$ produces a surface layer containing less than 5% nitrogen in each LPCVD oxide layer, so that the interfacial trap density is reduced. This improves the insulation breakdown characteristics of the ONO dielectric layer.

Referring to FIG. 1, there is shown a flash memory device that comprises a plurality of strings connected in parallel with the bit lines (B/L1, B/L2 . . . ) 137 to form a cell block. The cell blocks preferably are symmetrically arranged about the bit line contacts 132. The string can include a plurality of cell transistors having word lines (W/L1, W/L2 . . . W/L16) 123 as gates, which are connected in series between two selection transistors respectively having a string select line SSL and ground select line GSL as the gates.

Figure 2A:
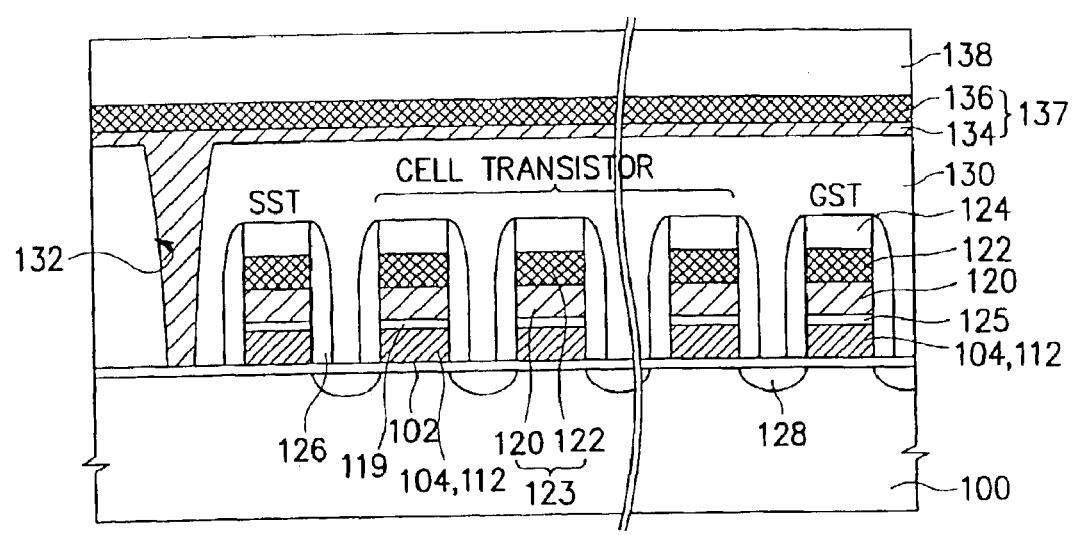
FIGS. 2A and 2B are cross sectional views of the memory cells of FIG. 1 taken along the bit line and word line, respectively.
Figure 2B:
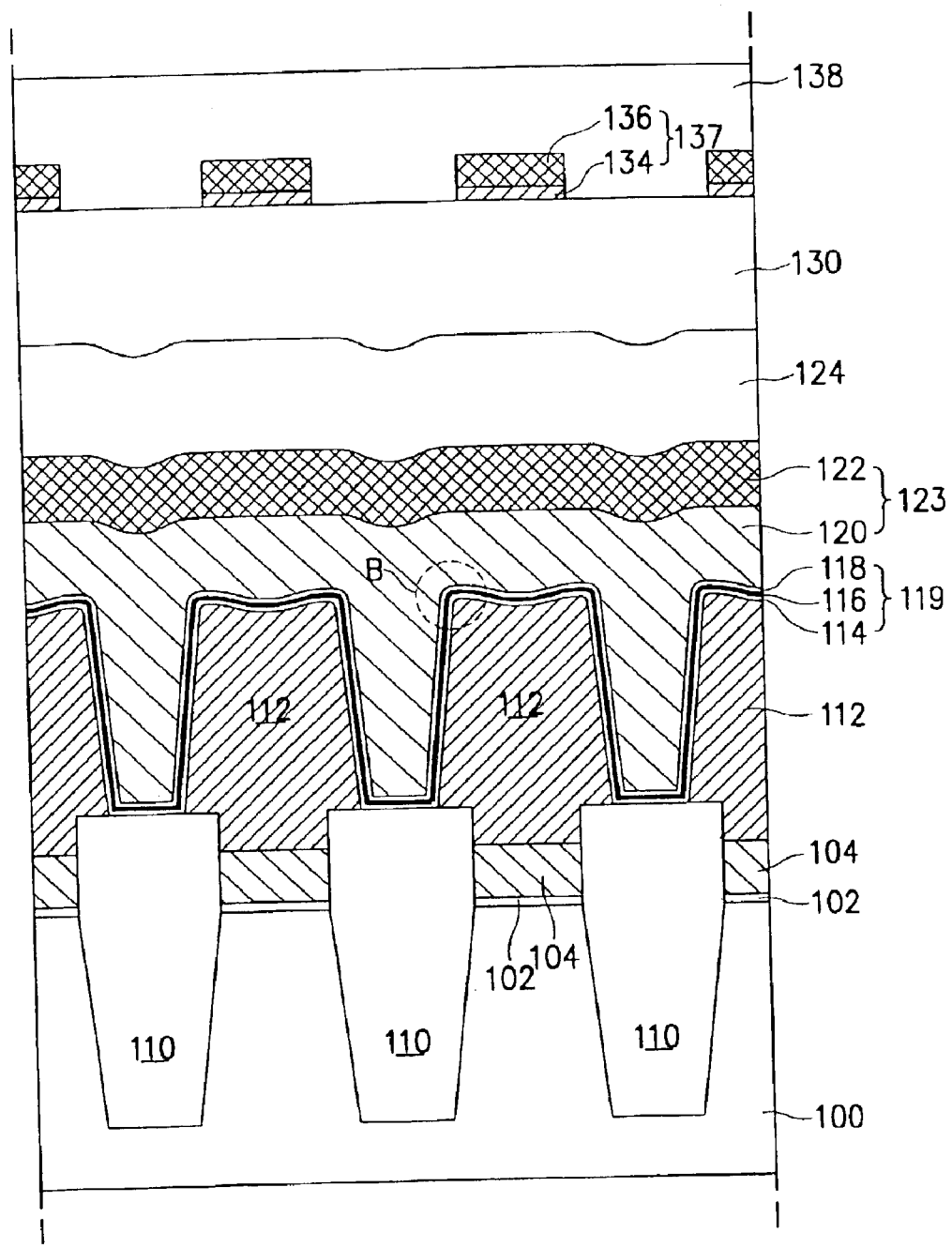

As shown in FIG. 2A, the string select transistor SST and ground select transistor GST do not require the floating gate to store data, and therefore can connect the floating gate 104, 112 and the control gate 123 with a metal link through the butting contact 125 in the upper part of the element isolation region, as show in FIGS. 2A and 2B. Thus, no dielectric interlayer is required in these transistors. The select transistors SST and GST therefore electrically serve as the Metal Oxide Semiconductor (MOS) transistors each having a gate of a single layer. The drain of the string select transistor SST can be connected with the bit line 137 through the bit line contact hole 132 while the source of the ground select transistor GST is connected with a common source line CSL (not shown).

The bit line 137 typically has a polycide structure composed of a polysilicon layer 134 and a metal silicide layer 136 to reduce the electrical resistance. Preferably, the lower part of the bit line contact hole 132 is made to have higher junction concentration than the source/drain of the cell transistor.

The cell transistor preferably has a stacked gate structure which consists of a floating gate 104, 112 formed over a semiconductor substrate 100 with a tunnel oxide layer 102 interposed therebetween for F-N tunneling, and a control gate 123 formed over the floating gate 104, 112 with a dielectric interlayer 119 interposed therebetween. Preferably, the source/drain region 128 of the cell transistor has a Lightly Doped Drain (LDD) structure consisting of an N− region and N+ region.

The floating gate preferably is comprised of at least a second polysilicon layer 112 patterned so as to cover the active regions, a first polysilicon layer 104 patterned according to the active regions, and part of the edges of the STI regions 110 formed on both sides of each active region (see, FIG. 2B). In the flash memory having a SA-STI structure, since the area of the first polysilicon layer 104 formed according to the active pattern becomes smaller than that of the conventional floating gate, the second polysilicon layer 112 is additionally deposited to increase the area of the dielectric interlayer 119 by increasing the height of the side walls of the floating gate. Increasing the area of dielectric interlayer 119 therefore also increases the coupling coefficient.

The control gate 123 preferably has a polycide structure composed of a metal suicide layer 122 deposited on a polysilicon layer 120, connected with the adjacent control gate 123 to form the word line. The dielectric interlayer 119 preferably is a composite layer comprised of a first oxide layer 114, a nitride layer 116, and a second oxide layer 118 (ONO) to transfer the voltage of the control gate 123 to the floating gate 104, 112, and to retain the charged characteristics of the floating gate 104, 112. While each oxide layer of the conventional ONO dielectric layer is made using a thermal oxidation process, the first and second oxide layers 114, 118 of the inventive ONO dielectric layer preferably are deposited by a LCPVD process, preferably at a temperature of from about 650 to about 800° C., and at a pressure of from about 1 to about 100 Pa, and then preferably the substrate including inventive oxide layers 114, 118 are annealed in an atmosphere of $N_2O$ or NO or $NH_3$.

Generally, since a LPCVD process forms the oxide layers under a low pressure, preferably a pressure not exceeding 250 Pa, the diffusivity of the molecules of the reaction gas is increased to impart good uniformity and conformal step coverage to the layer. In addition, the low pressure operation reduces gaseous reactions to prevent contamination of fine particles, while it densifies the deposited layer because of the relatively higher deposition temperature compared to Atmosphere Pressure Chemical Vapor Deposition (APCVD) and Plasma Enhanced Chemical Vapor Deposition (PECVD). Hence, if the oxide layer is obtained using a LPCVD process, preferably at a temperature of from about 650 to about 800° C., and at a pressure of from about 1 to about 100 Pa, the slow deposition speed due to the low pressure makes it possible to control the thickness of the oxide layer to be thinner as well as more dense, when compared to oxide layers that are produced by a APCVD or a PECVD process. Moreover, the LPCVD-produced oxide layer preferably is additionally densified through annealing in the atmosphere of $N_2O$ or NO or $NH_3$, thus finally having properties similar to the thermal oxide layer but at a much reduced thickness. Thus, the thickness of the ONO dielectric interlayer 119 of the invention is considerably reduced to increase the coupling coefficient, and reduce the leakage current because of the densification of the layer, thereby improving the charge retention property.

Further, the annealing process in the atmosphere of $N_2O$ or NO or $NH_3$ causes the first and second LPCVD-produced oxide layers 114 and 118 of the ONO dielectric interlayer 119 to have a surface layer containing less than 5% nitrogen, thereby reducing Si-dangling bonds from the surfaces of the LPCVD-produced oxide layers 114 and 118. The thermal annealing also produces strong Si—N combinations that are not easily broken by hot electrons injected from the floating gate 112 to make the layer stable even under heat or electric field stress. The nitrogen existing near the interface between the floating gate 112 and the first oxide layer 114 prevents the injected electrons from floating gate 112 from being easily trapped in the first oxide layer 114, thereby reducing the number of the hot electrons trapped in the combination broken sites of the first oxide layer 114. Therefore, the interfacial trap density is reduced which improves the insulation breakdown characteristics of first oxide layer 114. In addition, the nitrogenous surface layers formed in the first and second oxide layers 114 and 118 physically obstruct the out-diffusion of the dopants added to the control gate 123 and floating gate 112 by the subsequent heat treatment.

Although the nitrogen combines with three silicon atoms in the interface between the oxide layers and lower support layer, it combines with two silicon atoms in the bulk of the oxide layer leaving one electron as a dangling bond. This dangling bond may be filled with hydrogen in the subsequent oxidation. However, if the amount of nitrogen exceeds 5%, the bulk of the oxide layer will have many dangling bonds even after the subsequent oxidation, which work as the trap sites resulting in leakage current. Production of leakage current, however, can be prevented by the inventive LPCVD-produced oxide layer having the surface layer containing less than 5% nitrogen through annealing in the atmosphere of $N_2O$ or NO or $NH_3$, thus securing high reliability.

Referring to FIGS. 2A and 2B, reference numeral 124 represents the word line capping layer, 130 represents the first insulating interlayer to insulate the gate from the bit line 137, and 138 represents the second insulating interlayer to insulate the bit line 137 from the metal line (not shown).

Figure 3:
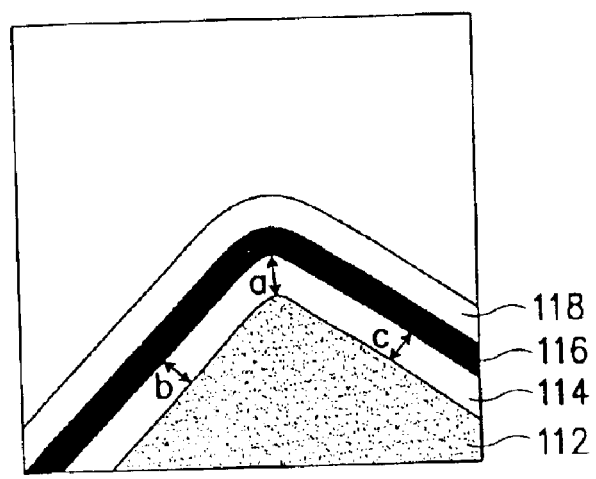
FIG. 3 is an enlarged schematic diagram of the portion "B" in FIG. 2B.

Referring now to FIG. 3, the ONO dielectric interlayer 119 comprises the first and second oxide layers 114 and 118 deposited with good uniformity and conformal step coverage by a LPCVD process, so that it is more uniformly deposited over the whole surface of the floating gate 112 compared to that produced by the conventional thermal oxidation. Generally, when forming the oxide layer over the whole surface of the floating gate 112 patterned to have a 90° corner by thermal oxidation, the thickness of the oxide layer at the corners of the floating gate (a) is $1/\sqrt{2}$, assuming that the thickness of the upper part (c) is 1. When the first oxide layer 114 is obtained using a LPCVD process according to the invention, however, the ratio of the thickness of the first oxide layer 114 at the upper (c) or side part (b) of floating gate 112 to the thickness of the first oxide layer 114 at the corners (a) of floating gate 112 does not exceed 1.4.

FIGS. 4 to 8 are cross sectional views taken along the word line, and illustrate a method of fabricating a flash memory device according to a preferred embodiment of the present invention.

Figure 4:
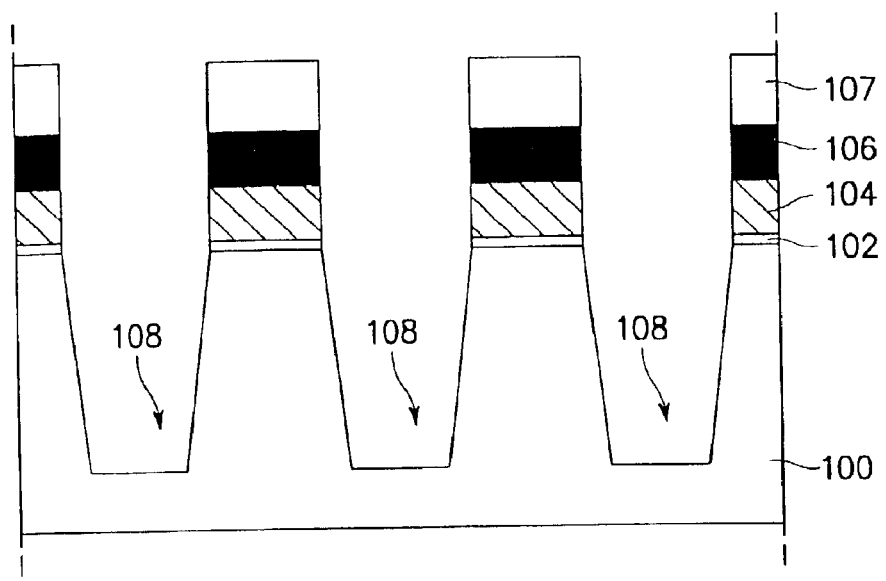
FIGS. 4 to 8 are cross sectional views illustrating a method of fabricating a flash memory device according to an embodiment of the present invention.

FIG. 4 illustrates forming the first polysilicon layer 104 and trench 108. Photolithography and ion implantation usually are used to implant N-type impurities into the surface of a P-type semiconductor substrate 100, which then is subjected to heat treatment at high temperature to diffuse the N-type impurities to a desirable depth to form N-type wells (not shown). Likewise, by using photolithography and ion implantation, P-type impurities can be implanted into the surface of the substrate 100 but not into the N-type wells and the cell array region within the N-type wells. The substrate then is subjected to heat treatment of high temperature to diffuse the P-type impurities to form P-type wells (not shown). Skilled artisans are capable of implanting N-type or P-type impurities into a surface of a semiconductor substrate and forming their respective N-type and P-type wells, using the guidelines provided herein. Generally, the well for forming the P-Channel Metal Oxide Semiconductor (PMOS) transistor of the peripheral circuit part is called the P-well (not shown), and the well formed in the cell array region within the N-type well is called the pocket P-well.

Subsequently, a thin oxide or oxynitride layer preferably is grown over the substrate 100 with a thickness of from about 70 to about 100 Å to form the tunnel oxide layer 102 of the cell transistor. The performance of the flash memory to preserve the stored data depends, in part, on the reliability of the tunnel oxide layer 102, and is limited by the number of repeating programming and erasing. The competent memory should endure programming and erasing data at least a million times. The tunnel oxide layer 102 having good endurance for such a competent memory preferably is prepared through a wet oxidation process using $O_2$, $H_2$ and $N_2O$ gases, along with the addition of a small amount of HCl gas for gettering under a low pressure, preferably less than 700 mTorr. This may enhance the density of the tunnel oxide layer 102, and make it possible to readily control its thickness.

Thereafter, the first polysilicon layer 104 is deposited on the tunnel oxide layer 102 at a thickness of about 300 to about 1000 Å to form the floating gate preferably using a LPCVD process. Conventionally, the polysilicon layer for the gate is deposited using thermal deposition in the crystalline phase at a temperature of about 620° C., and then doped with highly concentrated N-type impurities by ion implantation or diffusion of $POCl_3$. However, this conventional method may cause the dopants to move into the tunnel oxide layer 102 along the grain boundary of the polysilicon layer already formed, thus degrading the tunnel oxide layer 102. When the polysilicon layer is deposited in the amorphous phase in situ, the subsequent heat treatment transforms the amorphous phase into the crystalline phase, so that the volume of the polysilicon layer is reduced to generate a very great stress in the interface between the polysilicon layer and the tunnel oxide layer 102, thereby resulting in degradation of the tunnel oxide layer 102.

In order to prevent this phenomenon, the inventive method includes depositing the polysilicon layer 104 in the crystalline phase at a temperature of 600° C. or more, or the following deposition process, preferably in the same LPCVD chamber. Specifically, a thin film crystalline phase polysilicon layer first is deposited, and has a thickness of from about 10 to about 100 Å, by pyrolyzing $SiH_4$ gas at a temperature of from about 600 to about 640° C., and at a pressure of from about 10 to about 100 Pa. Then, an amorphous thin film is deposited by using silane ($SiH_4$) and phosphine ($PH_3$) gas in situ at a temperature of from about 520 to about 560° C., and at a pressure of from about 10 to about 100 Pa. Finally a thin film crystalline phase polysilicon layer is deposited to have a thickness of from about 10 to about 100 Å, by pyrolyzing $SiH_4$ gas at a temperature of from about 600 to about 640° C., and at a pressure of from about 10 to about 100 Pa. This prevents the subsequent heat treatment from causing the dopants existing in the first polysilicon layer 104 to diffuse into the lower tunnel oxide layer 102, and thereby prevents degradation of the tunnel oxide layer 102.

Subsequently deposited, preferably by a LPCVD process over the first polysilicon layer 104 is a silicon nitride layer 106, preferably having a thickness of from about 1500 to about 2000 Å. The silicon nitride layer 106 serves as the polishing stop in a subsequent CMP (Chemical and Mechanical Polishing) process. A high temperature oxide layer 107 then preferably is deposited over the silicon nitride layer 106 to a thickness of from about 1000 to about 2000 Å by a LPCVD process, and then an SiON layer is deposited with a thickness of about 800 Å, forming an anti-reflective layer (not shown), which serves to prevent diffused reflection in the subsequent photolithography, and then is removed in the subsequent etching for forming trenches.

The photolithography and etching are successively performed to etch the anti-reflective layer (not shown) and high temperature oxide layer 107 so as to form the hard mask pattern to define the active regions. According to the hard mask pattern, the silicon nitride layer 106 and the first polysilicon layer 104 are successively etched, and then the substrate 100 is etched to a given depth, forming the trenches 108. Preferably, the trench 108 is etched to have the lower part profiled round by using isotropic etching. Skilled artisans are capable of using photolithography and etching to produce the respective layers of the present invention, and to form the trenches 108 having the requisite profile, using the guidelines provided herein.

Figure 5:
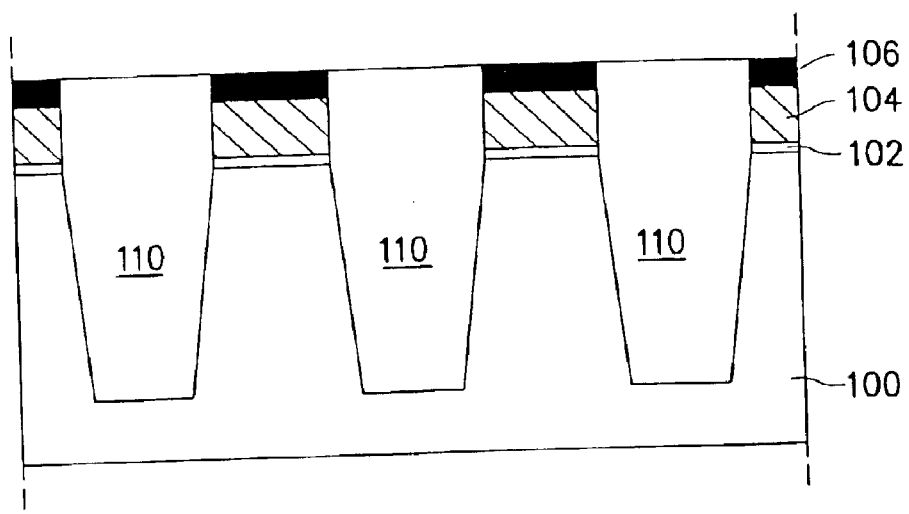

FIG. 5 illustrates forming STI regions 110. As shown in FIG. 5, the high temperature oxide layer 107 is removed after forming the trenches 108. An oxide layer 110 having good gap filling characteristics such as Undoped Silicate Glass (USG) and High Density Plasma (HDP) with a thickness of about 5000 Å then is deposited over the inside of the trenches 108 and the silicon nitride layer 106, and then a Plasma Enhanced Tetra-Ethyl-Ortho-Silicate (PE-TEOS) layer with a thickness of from about 2000 to about 4000 Å is deposited to form a capping oxide layer (not shown). The oxide layer 110 then can be polished by CMP until exposing the silicon nitride layer 106 to achieve the STI regions filled with the flattened oxide layer.

Figure 6:
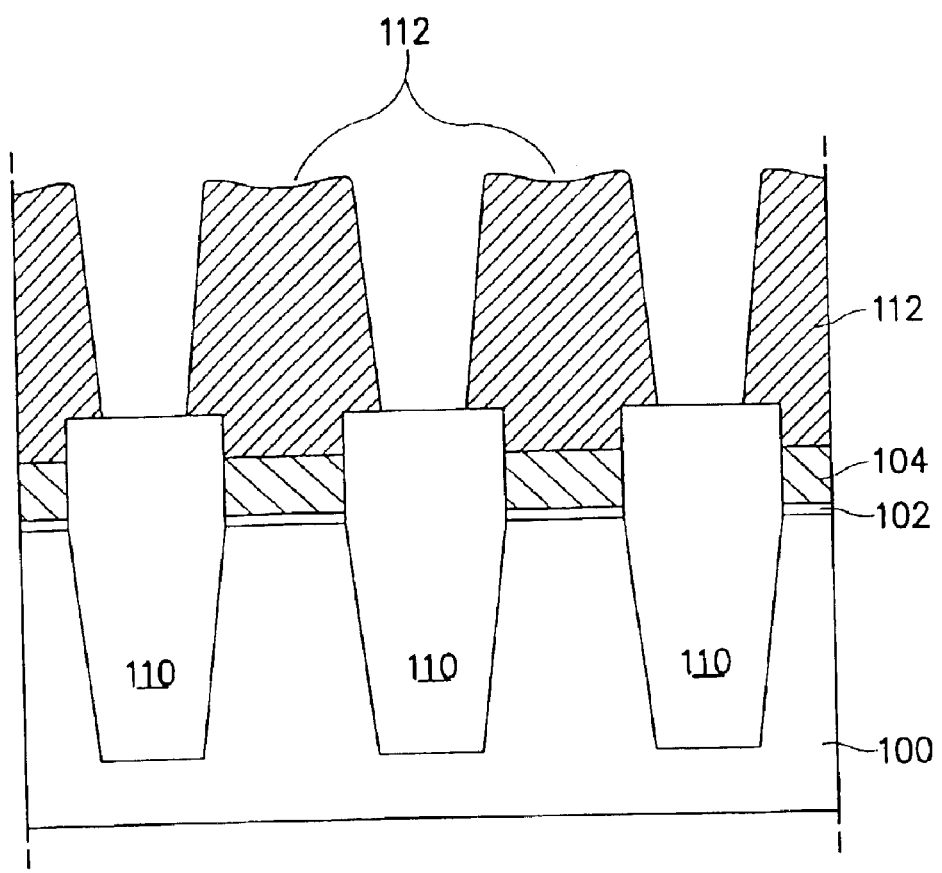

In order to form the second polysilicon layer 112 as shown in FIG. 6, the silicon nitride layer 106 is removed by, for example, phosphoric acid stripping to expose the first polysilicon layer 104, over which the second polysilicon layer 112 for the floating gate is deposited with a thickness of about 3000 Å or more by a LPCVD process. The second polysilicon layer 112 is deposited in such a manner to increase the area of the subsequent ONO dielectric interlayer, and is used for the floating gate, along with the first polysilicon layer 104. Since the first polysilicon layer 104 directly contacts the tunnel oxide layer 102, the second polysilicon layer 112 may be doped, for example, by means of $POCl_3$ diffusion, ion implantation, or in-situ doping. Alternatively, the second polysilicon layer 112 may be deposited in the crystalline phase along with in-situ doping at a temperature of 600° C. or more, or in a multi-stage deposition process in the same LPCVD chamber, as described above with respect to the first polysilicon layer 104. Portions of the second polysilicon layer 112 covering the STI regions 110 then can be removed by, for example, photolithography and etching, to isolate the floating gates of adjacent cell transistors from each other along the bit line.

Figure 7:
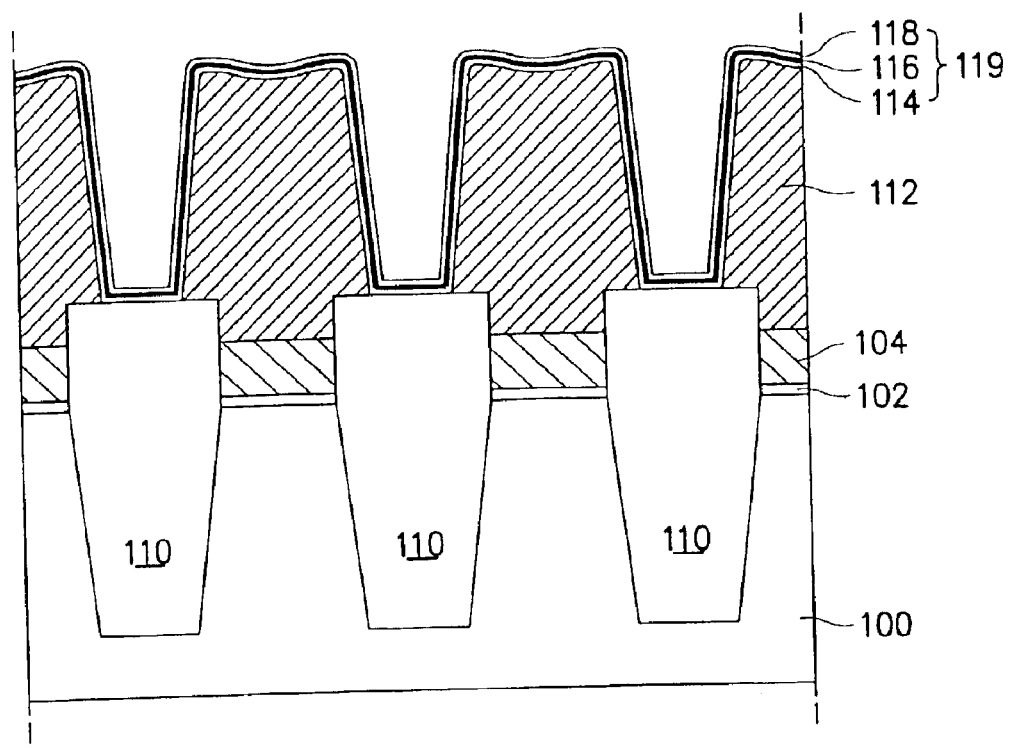

Referring now to FIG. 7, the ONO dielectric interlayer 119 can be deposited over the second polysilicon layer 112 in order to insulate the floating gates from the control gates. The deposition of the ONO dielectric interlayer 119 can take place in accordance with the following preferred process. Substrate 100 can be loaded in a LPCVD chamber that has been maintained at a temperature of from about 400 to about 650° C., and then the chamber can be additionally heated to a temperature of from about 650 to about 800° C., and supplied with $SiH_4$ and $N_2O$ gases under a pressure of from about 10 to about 100 Pa to deposit the $SiO_2$ layer 114 with a thickness of from about 20 to about 80 Å. In this case, $SiH_4$ gas may be replaced by dichloro silane ($Si_2H_2Cl_2$) gas, or any other gas capable of depositing $SiO_2$ layer 114. Then, the substrate can be annealed in situ at an increased temperature of from about 700 to about 1000° C., preferably from about 800 to about 850° C., in an atmosphere of $N_2O$ or NO or $NH_3$, so that the $SiO_2$ layer 114 has a thickness of from about 10 to about 50 Å. It is preferred to control the flow of $N_2O$ gas at a speed of about 200 sccm (Standard Cubic Centimeter Per Minute).

If the first oxide layer is formed by thermal oxidation, as it has been prior to the present invention, the growth of the first oxide layer is enhanced on the floating gate composed of the doped polysilicon, so that it is very difficult to control the thickness of the first oxide layer to thereby produce a thin layer, and the dopants in the polysilicon layer readily diffuse into the first oxide layer and increase the leakage current. When a LPCVD process is used to grow the first oxide layer 114 at a slow speed in accordance with the present invention, however, the thickness may be controlled to produce a thin layer. In addition, the substrate preferably is annealed in an atmosphere of NO or $N_2O$ or $NH_3$ gas to densify the first oxide layer 114 and form a surface layer containing less than 5% nitrogen in the first oxide layer, so that the dopants of the lower doped polysilicon are prevented from diffusing into the first oxide layer 114, thus reducing the leakage current. The deposition and annealing of the first oxide layer 114 may be performed in situ, (e.g., in the same chamber), or in a separate reaction chamber. In the latter case, the annealing temperature may be increased to more fully densify the oxide layer. If NO gas is used during the annealing, the annealing temperature may be lowered because NO gas is decomposed at a lower temperature than $N_2O$ gas. However, NO gas is toxic, and therefore, it is desirable to use $N_2O$ gas in view of environmental concerns.

The substrate then can be loaded in an LPCVD chamber to deposit a $Si_3N_4$ layer 116 over the first oxide layer 114 with a thickness of from about 20 to about 100 Å by using, for example, $Si_2H_2Cl_2$ and $NH_3$ gases at a temperature of about 780° C. under a pressure of about 30 Pa. Thereafter, the LPCVD chamber preferably is supplied with $SiH_4$ and $N_2O$ gases at a temperature of from about 650 to about 800° C. under a pressure of from about 1 to about 100 Pa to deposit $SiO_2$ layer 118 with a thickness of from about 20 to about 80 Å. Then, the temperature of the LPCVD chamber can be increased up to from about 700 to about 1000° C., preferably from about 800 to about 850° C., to once again anneal the substrate in an atmosphere of $N_2O$ or NO or $NH_3$ gas at a speed of about 200 sccm, thus growing $SiO_2$ layer 118 so that it has a thickness of from about 10 to about 50 Å.

While the second oxide layer conventionally has been formed by thermal and wet oxidation at a high temperature of 950° C. or more resulting in an increase of the overall heat requirement, the inventive method preferably employs a LPCVD process to deposit the second oxide layer 118 at a relatively low temperature of from about 650 to about 800° C. Therefore, the tunnel oxide layer 102 does not undergo degradation, and the threshold voltage of the transistor is not changed when the preferred method of the invention is used. The deposition and annealing of the second oxide layer 118 may be performed in situ, (e.g., in the same apparatus), or in a separate reaction chamber.

Figure 8:
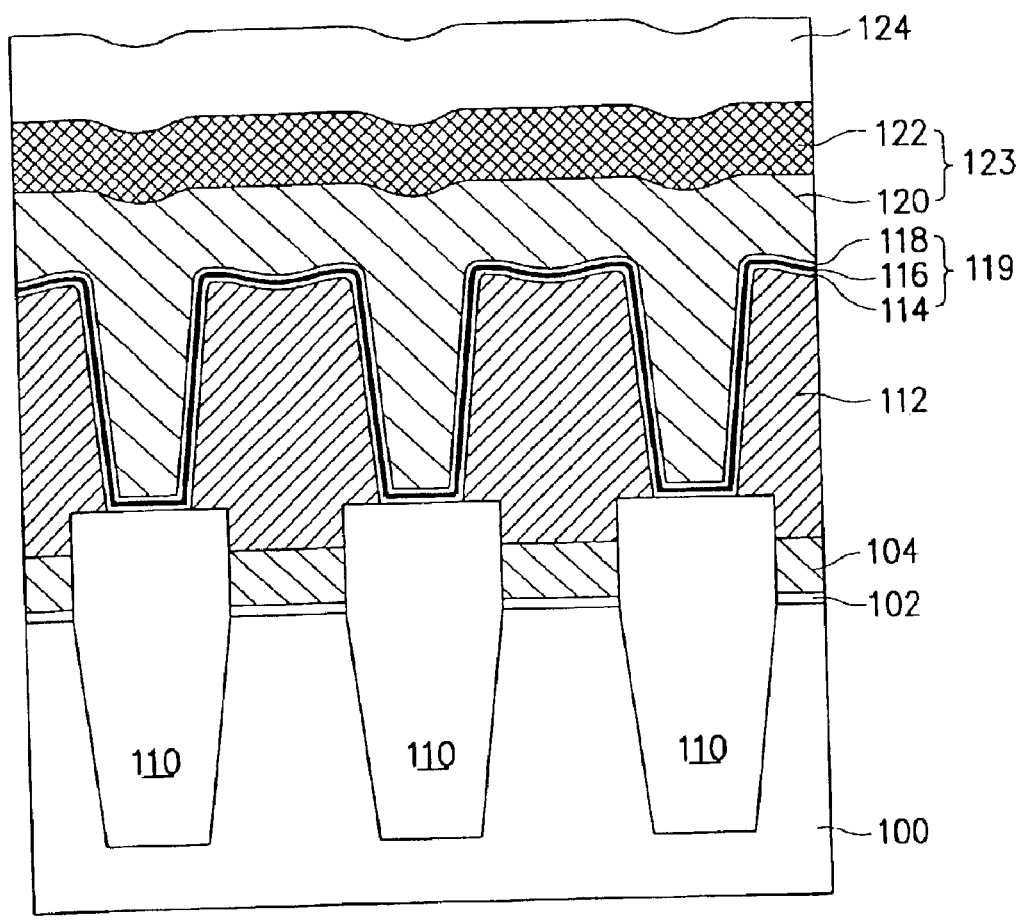

FIG. 8 illustrates a preferred method of forming the control gate 123. Control gate 123 can be formed by sequentially depositing on the ONO dielectric interlayer 119, an $N^+$ doped polysilicon layer 120, and a metal silicide layer 122 composed of titanium silicide (TiSix) or tantalum (TaSix). Preferably, the polysilicon layer 120 of the control gate 123 has a thickness of about 1000 Å, and the metal silicide layer 122 has a thickness of from about 1000 to about 1500 Å. The control gate polysilicon layer 120 preferably is deposited in situ at a temperature of 600° C. or more, as described above with respect to the first polysilicon layer 104 of the floating gate. Alternatively, the polysilicon layer 120 of the control gate may be deposited using a multi-stage deposition process in the same LPCVD chamber, as described above with respect to the first polysilicon layer 104 of the floating gate.

In this process, $SiH_4$ gas preferably is pyrolized at a temperature of from about 600 to about 640° C. under a pressure of from about 1 to about 100 Pa to deposit a crystalline thin film having a thickness of from about 10 to about 100 Å. Then, an amorphous thin film with doping may be deposited in situ by using, for example, $SiH_4$ and $PH_3$ gases at a temperature of from about 520 to about 560° C. under a pressure of from about 1 to about 100 Pa, and then $SiH_4$ gas can be pyrolized at a temperature of from about 600 to about 640° C. under a pressure of from about 1 to about 100 Pa to deposit a crystalline thin film having a thickness of from about 10 to about 100 Å. This method prevents the dopants of the control gate polysilicon layer 120 from diffusing into the upper oxide layer 118 of the ONO dielectric interlayer 119 during any subsequent heat treatment, thus protecting the upper oxide layer 118 from degradation. Finally, after depositing a word line capping layer 124, for example, a PE-TEOS layer having a thickness of about 2000 Å, over the control gate 123, photolithography and etching preferably are performed to successively etch the word line capping layer 124, control gate 123, dielectric interlayer 119 and floating gate layer 112, 104, thus forming the gates of the cell transistors and select transistors.

Figure 12:
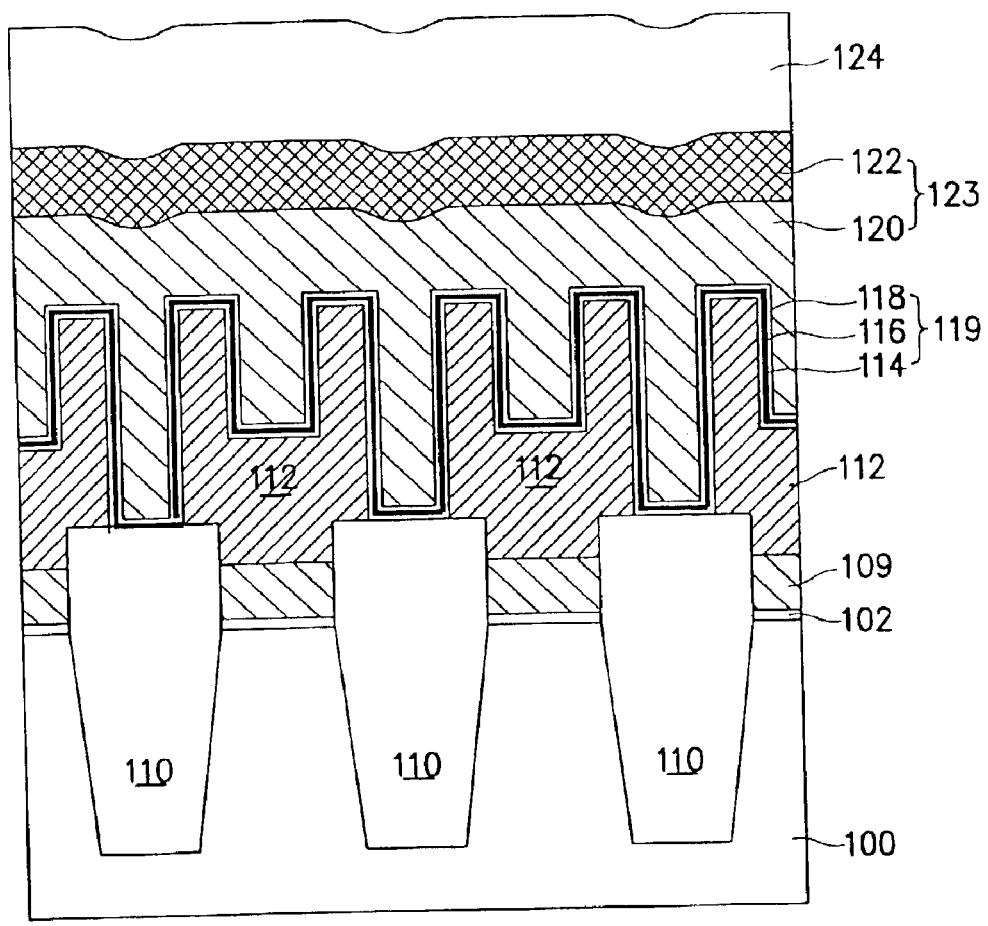
FIG. 12 is a cross sectional view illustrating the memory cells of a flash memory device fabricated according to another embodiment of the present invention.

FIG. 12 illustrates the fabrication of a flash memory device according to another embodiment of the present invention. As shown therein, the second polysilicon layer 112 for the floating gate is etched to remove the portions over the STI regions 110, and then patterned according to an additional mask to have at least one undulation. Alternatively, the undulations may be produced while removing the portions of the second polysilicon layer 112 over the STI regions by using a single mask. Skilled artisans are capable of producing undulations in second polysilicon layer 112, using the guidelines provided herein.

These undulations formed in the second polysilicon layer 112 serve to increase the area of the subsequently formed ONO dielectric layer 119, and thus the capacitance $C_{ONO}$, thereby achieving a greater coupling coefficient. If the conventional ONO dielectric layer is deposited by thermal oxidation over the second polysilicon layer including such undulations, the lower oxide layer has its thickness decreased at the corners of the second polysilicon layer which considerably increases the leakage current. However, the inventive LPCVD ONO dielectric layer is deposited uniformly throughout the upper, side and corner parts of the second polysilicon layer, thereby increasing the coupling coefficient without any increase of leakage current.

According to another preferred embodiment of the invention, when forming the LPCVD ONO dielectric layer, the second annealing can be performed in an atmosphere of NO or $N_2O$ or $NH_3$ before depositing the second oxide layer and after forming the nitride layer. According to a further embodiment of the present invention, an additional dry or wet oxidation can be performed before each annealing process during formation of the LPCVD ONO dielectric layer. Of course, the method of forming the inventive LPCVD ONO dielectric layer may be applied to the gate oxide layer of the MOS transistor or the dielectric layer of the DRAM capacitor.

As described above, the present invention can control the thickness of the upper and lower oxide layers of the ONO dielectric layer to produce a relatively thin layer by depositing them with a LPCVD process. Depositing these layers and controlling their respective thicknesses in this manner increases the coupling coefficient. Moreover, the annealing process performed in an atmosphere of $N_2O$ or NO or $NH_3$ after each LPCVD serves to densify the LPCVD oxide layers, reducing leakage current, and improving the charge retention property. Further, the annealing process produces surface layers containing less than 5% nitrogen in each LPCVD oxide layer, which reduces the interfacial trap density and improves the insulation breakdown characteristics of the ONO dielectric layer.

EXAMPLES

The following description reveals the results of experiments carried out in an effort to compare the charge retention property of the inventive LPCVD ONO dielectric interlayer 119 with those of the conventional ONO dielectric interlayer obtained by thermal oxidation. In these experiments, the target thickness of the ONO dielectric interlayer was determined to be 160 Å. The thickness of the conventional ONO dielectric layer was measured to be about 190 Å, and that of the inventive LPCVD ONO was about 160 Å, as determined by TEM (Transmission Electron Microscopy). The reason for the difference in thickness of the respective ONO dielectric layers was believed to be caused by the low oxide layer of the conventional ONO dielectric layer being grown to a thickness of about 40 Å over the bare wafer, while the upper oxide layer was grown to a thickness of about 84 Å over the floating gate polysilicon layer due to the oxidation enhancement caused by the dopants. In addition, the thickness of the nitride layer was consumed by about 20 Å, and measured about 80 Å due to the thermal oxidation.

Figure 9:
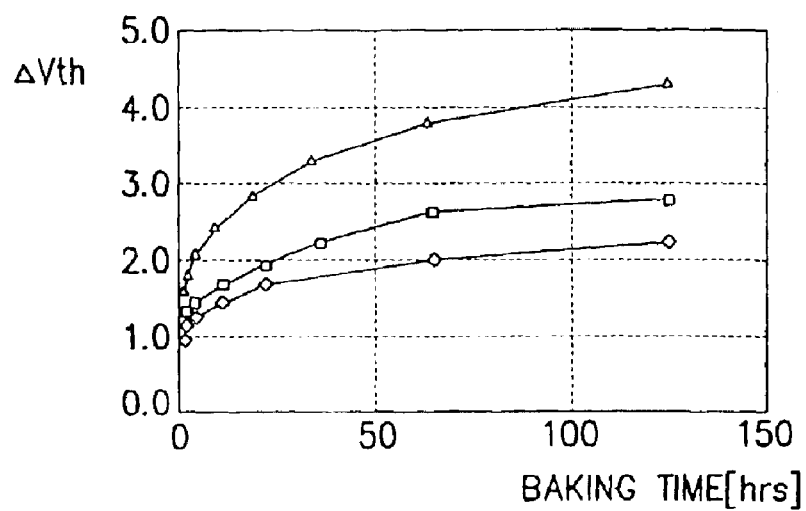
FIG. 9 is a graph illustrating the charge retention property of the inventive ONO dielectric layer compared to that of a conventional layer.

Referring to FIG. 9, variation ($\Delta$Vth) of the threshold voltage is varied according to the baking time at a temperature of 300° C. In the graph, reference symbol $\Delta$ represents the charge retention property of the conventional ONO dielectric layer, $\square$ represents the charge retention property of the LPCVD ONO dielectric layer having been subjected to wet oxidation at a temperature of 850° C. for 30 minutes, and $\diamond$ represents the charge retention property of the inventive LPCVD ONO dielectric layer having been subjected to $N_2O$ annealing at a temperature of 850° C. for 60 minutes. Exerting the baking stress at a temperature of 300° C. for 120 hours, the variation of the threshold voltage ($\Delta$Vth) was respectively measured 4.3V, 2.8V, and 2.2V for: (i) the ONO dielectric interlayer formed by thermal oxidation; (ii) the LPCVD ONO dielectric interlayer subjected to wet oxidation; and (iii) the inventive LPCVD ONO dielectric interlayer subjected to annealing, respectively. Hence, it is readily noted that the inventive LPCVD ONO dielectric interlayer had the best charge retention property. The reason is believed to because the LPCVD-produced oxide layer of the invention was not only densified by $N_2O$ annealing when compared to the thermal oxide-produced layer, but also the surface layer of the LPCVD-produced oxide layer containing nitrogen prevented the dopants of the control gate and floating gate from diffusing into the oxide layer to generate leakage current.

Figure 10:
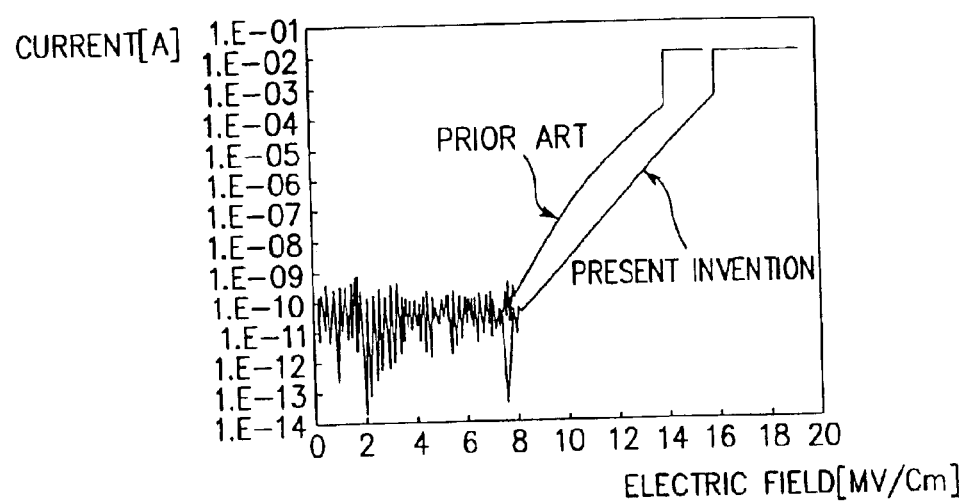
FIG. 10 is a graph illustrating the leakage current characteristics of the inventive ONO dielectric layer compared to those of a conventional layer.

Referring to FIG. 10, the insulation breakdown voltage was measured 2V lower, and the leakage current greater in the conventional thermal ONO dielectric interlayer, when compared to the inventive LPCVD-produced ONO dielectric interlayer. These results are seen even though the thickness of the equivalent oxide layer of the conventional ONO layer was greater than that of the inventive layer.

Figure 11:
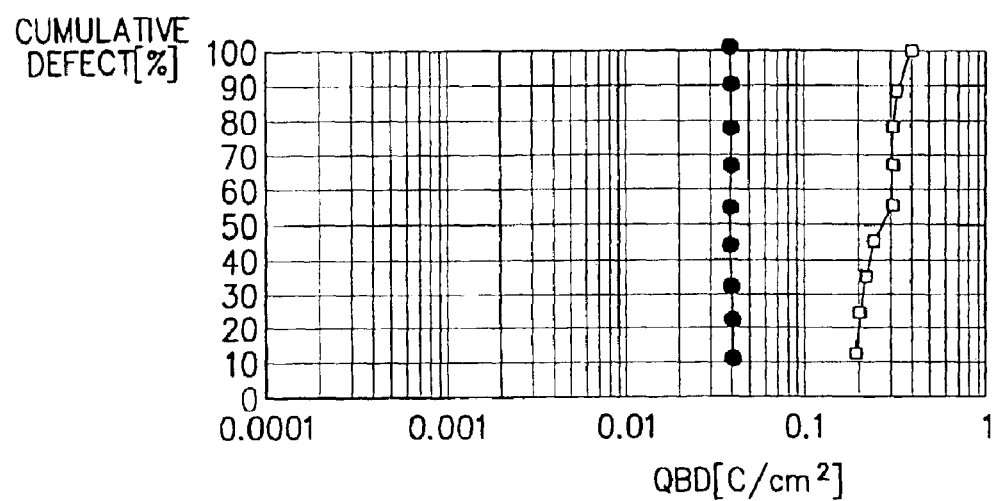
FIG. 11 is a graph illustrating the insulation breakdown characteristics of the inventive ONO dielectric layer compared to those of a conventional layer.

Referring to FIG. 11, the horizontal value $Q_{BD}$ represents the insulation breakdown time divided by the charge amount with a constant supplying of current at 10 mA/cm². Reference symbol ● represents the $Q_{BD}$ of the conventional ONO dielectric interlayer produced by thermal oxidation, and $\square$ represents the $Q_{BD}$ of the inventive LPCVD-produced ONO dielectric interlayer. It is noted that the inventive LPCVD-produced ONO dielectric interlayer had a greater $Q_{BD}$ than the conventional ONO dielectric layer produced by thermal oxidation. The reason is believed to be because the nitrogen contained in the LPCVD oxide layer increased the strength of the Si—N bonds against thermal or electric field stress, thereby improving the reliability of the layer. From the experiments, it was ascertained that the inventive LPCVD ONO dielectric layer had improved charge retention property and about a 4 to about 6% increased coupling coefficient even when the equivalent oxide layer had a smaller thickness, when compared to the conventional layer.

While the present invention has been described in connection with specifically preferred embodiments and examples accompanied by the attached drawings, it will be readily apparent to those skilled in the art that various changes and modifications may be made to the invention without departing from the spirit and scope thereof.

What is claimed is:

1. A method of fabricating a semiconductor device having a composite dielectric layer comprised of a first oxide layer, a nitride layer and second oxide layer, comprising:

providing a semiconductor substrate;

depositing the first oxide layer on the semiconductor substrate by a LPCVD process at a temperature of from about 650 to about 800° C., and at a pressure of from about 1 to about 100 Pa;

subjecting the substrate to first annealing under an atmosphere selected from the group consisting of $N_2O$, NO and $NH_3$ to form a surface layer in the first oxide layer containing less than 5% nitrogen;

depositing the nitride layer on the first oxide layer;

depositing the second oxide layer on the nitride layer by a LPCVD process at a temperature of from about 650 to about 800° C., and at a pressure of from about 1 to about 100 Pa; and subjecting the substrate to a second annealing under an atmosphere selected from the group consisting of $N_2O$, NO and $NH_3$ to form a surface layer in the second oxide layer containing less than 5% nitrogen.

2. The method as claimed in claim 1, wherein the first annealing is performed at a temperature of from about 700 to about 1000° C.

3. The method as claimed in claim 1, further comprising performing dry or wet oxidation before the first annealing.

4. The method as claimed in claim 1, wherein the second annealing is performed at a temperature of from about 700 to about 1000° C.

5. The method as claimed in claim 1, further comprising performing dry or wet oxidation before the second annealing.

6. The method as claimed in claim 1, wherein the first oxide layer is deposited and the substrate is subjected to first annealing in the same apparatus.

7. The method as claimed in claim 1, wherein the second oxide layer is deposited and the substrate is subjected to second annealing in the same apparatus.

8. The method as claimed in claim 1, wherein the first oxide layer, the nitride layer, and the second oxide layer are deposited, and the substrate is subjected to the first and second annealing in the same apparatus.

9. A method of fabricating a nonvolatile memory device having stacked gate memory cells composed of floating gates, and control gates formed over the floating gates with a dielectric interlayer interposed therebetween, comprising:

providing a semiconductor substrate;

forming element isolation regions to define active regions in the semiconductor substrate;

depositing a floating gate polysilicon layer over the substrate including the element isolation regions;

forming the dielectric interlayer; and depositing a control gate polysilicon layer over the dielectric interlayer, wherein forming the dielectric interlayer comprises:

depositing a first oxide layer on the floating gate and the substrate by a LPCVD process at a temperature of from about 650 to about 800° C., and at a pressure of from about 1 to about 100 Pa;

subjecting the substrate to a first annealing under an atmosphere selected from the group consisting of $N_2O$, NO and $NH_3$ to form a surface layer in the first oxide layer containing less than 5% nitrogen;

depositing a nitride layer on the first oxide layer;

depositing a second oxide layer on the nitride layer by a LPCVD process at a temperature of from about 650 to about 800° C., and at a pressure of from about 1 to about 100 Pa; and subjecting the substrate to a second annealing under an atmosphere selected from the group consisting of $N_2O$, NO and $NH_3$ to form a surface layer in the second oxide layer containing less than 5% nitrogen.

10. The method of fabricating a nonvolatile memory device as claimed in claim 9, wherein the element isolation regions are formed by a method comprising:

sequentially depositing a tunnel oxide layer and a polysilicon layer over the substrate;

forming a hard mask layer over the polysilicon layer;

patterning the hard mask layer with an active pattern;

etching the polysilicon layer and substrate according to the patterned hard mask to form trenches;

depositing an oxide layer over the patterned hard mask to fill the trenches; and etching the oxide layer to expose the polysilicon layer.

11. The method of fabricating a nonvolatile memory device as claimed in claim 10, wherein the polysilicon layer is deposited in the crystalline phase in situ at a temperature of about 600° C. or more.

12. The method of fabricating a nonvolatile memory device as claimed in claim 10, wherein the polysilicon layer is deposited by a process comprising depositing a crystalline thin film of polysilicon, depositing an amorphous thin film of polysilicon in situ, and depositing a crystalline thin film of polysilicon.

13. The method of fabricating a nonvolatile memory device as claimed in claim 9, wherein the floating gate polysilicon layer is deposited in the crystalline phase in situ at a temperature of about 600° C. or more.

14. The method of fabricating a nonvolatile memory device as claimed in claim 9, wherein the floating gate polysilicon layer is deposited by a process comprising depositing a crystalline thin film of polysilicon, depositing an amorphous thin film of polysilicon in situ, and depositing a crystalline thin film of polysilicon.

15. A method of fabricating a nonvolatile memory device as in claim 9, further comprising patterning the floating gate polysilicon layer to have at least an undulating portion.

16. The method of fabricating a nonvolatile memory device as claimed in claim 9, wherein the first annealing is performed at a temperature of from about 700 to about 1000° C.

17. The method of fabricating a nonvolatile memory device as claimed in claim 9, further comprising performing dry or wet oxidation before the first annealing.

18. A method of fabricating a nonvolatile memory device as claimed in claim 9, wherein the second annealing is performed at a temperature of from about 700 to about 1000° C. or RTA about 1050° C.

19. The method of fabricating a nonvolatile memory device as claimed in claim 9, further comprising performing dry or wet oxidation before the second annealing.

20. A method of fabricating a nonvolatile memory device as claimed in claim 9, wherein the first oxide layer is deposited and the substrate is subjected to first annealing in the same apparatus.

21. The method of fabricating a nonvolatile memory device as claimed in claim 9, wherein the second oxide layer is deposited and the substrate is subjected to second annealing in the same apparatus.

22. The method of fabricating a nonvolatile memory device as claimed in claim 9, wherein the first oxide layer, the nitride layer, and the second oxide layer are deposited, and the substrate is subjected to the first and second annealing in the same apparatus.

23. The method of fabricating a nonvolatile memory device as claimed in claim 9, wherein the control gate polysilicon layer is deposited in the crystalline phase in situ at a temperature of about 600° C. or more.

24. The method of fabricating a nonvolatile memory device as claimed in claim 9, wherein the control gate polysilicon layer is deposited by a process comprising depositing a crystalline thin film of polysilicon, depositing an amorphous thin film of polysilicon in situ, and depositing a crystalline thin film of polysilicon.

* * * * *